United States Patent
Huang et al.

(10) Patent No.: US 9,653,482 B2
(45) Date of Patent: May 16, 2017

(54) DISPLAY PANEL AND DISPLAY DEVICE

(71) Applicant: InnoLux Corporation, Miao-Li County (TW)

(72) Inventors: Hui-Min Huang, Miao-Li County (TW); Hsin-Hung Lin, Miao-Li County (TW); Li-Wei Sung, Miao-Li County (TW)

(73) Assignee: Innolux Corporation, Jhu-Nan, Miao-Li County (TW)

( * ) Notice: Subject to any disclaimer, the term of this patent is extended or adjusted under 35 U.S.C. 154(b) by 0 days.

(21) Appl. No.: 15/056,538

(22) Filed: Feb. 29, 2016

(65) Prior Publication Data

US 2016/0260745 A1 Sep. 8, 2016

(30) Foreign Application Priority Data

Mar. 3, 2015 (TW) .............................. 104106690 A

(51) Int. Cl.
*H01L 29/10* (2006.01)
*H01L 27/12* (2006.01)
*H01L 29/786* (2006.01)

(52) U.S. Cl.
CPC ...... *H01L 27/1214* (2013.01); *H01L 29/7869* (2013.01); *H01L 29/78606* (2013.01); *H01L 29/78696* (2013.01)

(58) Field of Classification Search
CPC ........... H01L 27/1214; H01L 29/78606; H01L 29/7869; H01L 29/78696
USPC .......................................................... 257/43
See application file for complete search history.

(56) References Cited

U.S. PATENT DOCUMENTS

| 8,420,441 | B2* | 4/2013 | Yamazaki | H01L 27/1225 |
| | | | | 438/104 |
| 9,337,349 | B2* | 5/2016 | Liu | H01L 29/66969 |
| 2004/0207569 | A1* | 10/2004 | Ho | G02F 1/13452 |
| | | | | 345/1.1 |
| 2011/0037068 | A1* | 2/2011 | Yamazaki | H01L 27/1225 |
| | | | | 257/43 |
| 2015/0325706 | A1* | 11/2015 | Liu | H01L 29/66969 |
| | | | | 257/43 |

FOREIGN PATENT DOCUMENTS

| TW | 201244112 A | 11/2012 |
| TW | 201501325 A | 1/2015 |

* cited by examiner

*Primary Examiner* — Tu-Tu Ho
(74) *Attorney, Agent, or Firm* — Muncy, Geissler, Olds & Lowe, P.C.

(57) ABSTRACT

A display panel comprises a TFT substrate and a display medium layer. The display medium layer is disposed on the TFT substrate. The TFT substrate comprises a TFT and a substrate. The TFT is disposed on the substrate and comprises a gate, a metal oxide layer, a source, a drain and a protection layer. The gate is disposed corresponding to the metal oxide layer. The protection layer is disposed on the metal oxide layer. Each of the source and the drain contacts the metal oxide layer through an opening of the protection layer. One side of the gate or one side of the metal oxide layer partially overlaps at least one of the openings. In addition, a display device is also disclosed.

8 Claims, 9 Drawing Sheets ns. According to some embodiments, a display panel comprises a thin film transistor (TFT) substrate and a display medium layer. The display medium layer is disposed on the TFT substrate. The TFT substrate comprises a TFT and a substrate. The TFT is disposed on the substrate and comprises a gate, a metal oxide layer, a source, a drain and a protection layer. The gate is disposed corresponding to the metal oxide layer. The protection layer is disposed on the metal oxide layer. Each of the source and the drain contacts the metal oxide layer through an opening of the protection layer. One side of the gate or one side of the metal oxide layer partially overlaps at least one of the openings.

DISPLAY PANEL AND DISPLAY DEVICE

CROSS REFERENCE TO RELATED APPLICATIONS

This Non-provisional application claims priority under 35 U.S.C. §119(a) on Patent Application No(s). 104106690 filed in Taiwan, Republic of China on Mar. 3, 2015, the entire contents of which are hereby incorporated by reference.

BACKGROUND

Field of Invention

This invention relates to a display panel and a display device.

Related Art

With the progress of technologies, flat display panels have been widely applied to various kinds of fields. Because flat display devices have compact structure, low power consumption, less weight and less radiation, they gradually take the place of cathode ray tube (CRT) display devices and are widely applied to various electronic products, such as mobile phones, portable multimedia devices, notebooks, TVs and display screens.

Taking a conventional liquid crystal display (LCD) panel as an example, it comprises a thin film transistor (TFT) substrate, a color filter substrate and a liquid crystal layer. The TFT substrate and the color filter substrate are disposed oppositely, and the liquid crystal layer is disposed between the TFT substrate and the color filter substrate. In the competitive market, the requirements about the size of the display panel and the color saturation of the display are rapidly increased as well as the demands for the performance and stability of the TFT. The TFT with metal oxide-based semiconductor (MOSs) can be manufactured at room temperature. It has better current output characteristic, lower leakage current and better electron mobility that is ten times higher than the amorphous silicon TFT (a-Si TFT). Accordingly, the power consumption of such display panel is reduced and the operation frequency of such display panel can be raised. Therefore, the metal oxide-based TFT becomes the mainstream driving element for the display panel and device.

Although the metal oxide semiconductor layer possesses better electric property, the electric property of the metal oxide semiconductor layer will be impaired during the subsequent processes of the TFT. To avoid the electric property of the metal oxide semiconductor layer from being impaired, a protection layer can be added and disposed on the semiconductor layer of the TFT in the conventional art. Then, since the source and the drain of the TFT must contact the semiconductor layer, the source and the drain need to contact the semiconductor layer through the opening of the protection layer. However, the opening of the protection layer will increase the layout area of the source and the drain, and the overlap area between the source or drain and the gate will be thus increased. Therefore, the feedthrough voltage of the pixel will be raised or the aperture ratio will be decreased, so as to deteriorate the display quality.

Therefore, it is an important subject to provide a display panel and a display device whereby the feedthrough voltage of the pixel won't be raised and the aperture ratio won't be decreased under the disposition of the protection layer, so as to enhance the display quality.

SUMMARY

An aspect of the disclosure is to provide a display panel and a display device whereby the feedthrough voltage of pixel can be lowered down or the aperture ratio can be increased.

According to some embodiments, a display panel comprises a thin film transistor (TFT) substrate and a display medium layer. The display medium layer is disposed on the TFT substrate. The TFT substrate comprises a TFT and a substrate. The TFT is disposed on the substrate and comprises a gate, a metal oxide layer, a source, a drain and a protection layer. The gate is disposed corresponding to the metal oxide layer. The protection layer is disposed on the metal oxide layer. Each of the source and the drain contacts the metal oxide layer through an opening of the protection layer. One side of the gate or one side of the metal oxide layer partially overlaps at least one of the openings.

According to some embodiments, a display device comprises a display panel and a backlight module. The display panel comprises a TFT substrate and a display medium layer. The display medium layer is disposed on the TFT substrate. The TFT substrate comprises a TFT and a substrate. The TFT is disposed on the substrate and comprises a gate, a metal oxide layer, a source, a drain and a protection layer. The gate is disposed corresponding to the metal oxide layer. The protection layer is disposed on the metal oxide layer. Each of the source and the drain contacts the metal oxide layer through an opening of the protection layer. One side of the gate or one side of the metal oxide layer partially overlaps at least one of the openings. The backlight module is disposed opposite to the display panel.

In one embodiment, the metal oxide layer is a channel layer of the TFT, a dielectric layer is disposed between the gate and the channel layer, and the material of the channel layer is metal oxide semiconductor.

In one embodiment, the source or the drain is disposed in one of the openings and contacts the dielectric layer or the channel layer.

In one embodiment, the gate comprises two opposite first sides, and the first sides respectively partially overlap the two openings of the protection layer.

In one embodiment, the metal oxide layer is a channel layer of the TFT and comprises two opposite second sides, and the second sides respectively partially overlap the two openings of the protection layer.

In one embodiment, the gate comprises two opposite first sides, the metal oxide layer is a channel layer of the TFT and comprises two opposite second sides, the first sides respectively partially overlap the two openings of the protection layer and the second sides respectively partially overlap the two openings of the protection layer.

In one embodiment, the dielectric layer disposed in one of the openings has a first thickness, the dielectric layer disposed between the channel layer and the gate has a second thickness, the difference between the second thickness and the first thickness is larger than or equal to zero and less than 3000 Å, or larger than or equal to zero and less than the thickness of the protection layer.

In one embodiment, the TFT substrate further comprises a buffer layer disposed on the substrate. The metal oxide layer is disposed on the buffer layer. The metal oxide layer comprises a channel area, the gate is disposed on the channel area by a dielectric layer, and the material of the channel area is metal oxide semiconductor.

In one embodiment, the metal oxide layer further comprises two conducting areas respectively disposed on two sides of the channel area, the source or the drain is disposed in one of the openings and contacts the buffer layer and one of the conducting areas.

As mentioned above, regarding the display panel and the display device, the protection layer of the TFT substrate is disposed on the metal oxide layer, the source and the drain respectively contact the metal oxide layer through the openings of the protection layer, and a side of the gate or the metal oxide layer partially overlaps at least one of the openings. Thereby, in some embodiments, in comparison with the conventional art, the side of the gate or the metal oxide layer partially overlaps one of the openings, so that the feedthrough voltage of the pixel can be lowered down or the aperture ratio can be increased, and the display quality can be enhanced.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION

The present disclosure will be apparent from the following detailed description, which proceeds with reference to the accompanying drawings, wherein the same references relate to the same elements.

Figure 1A:
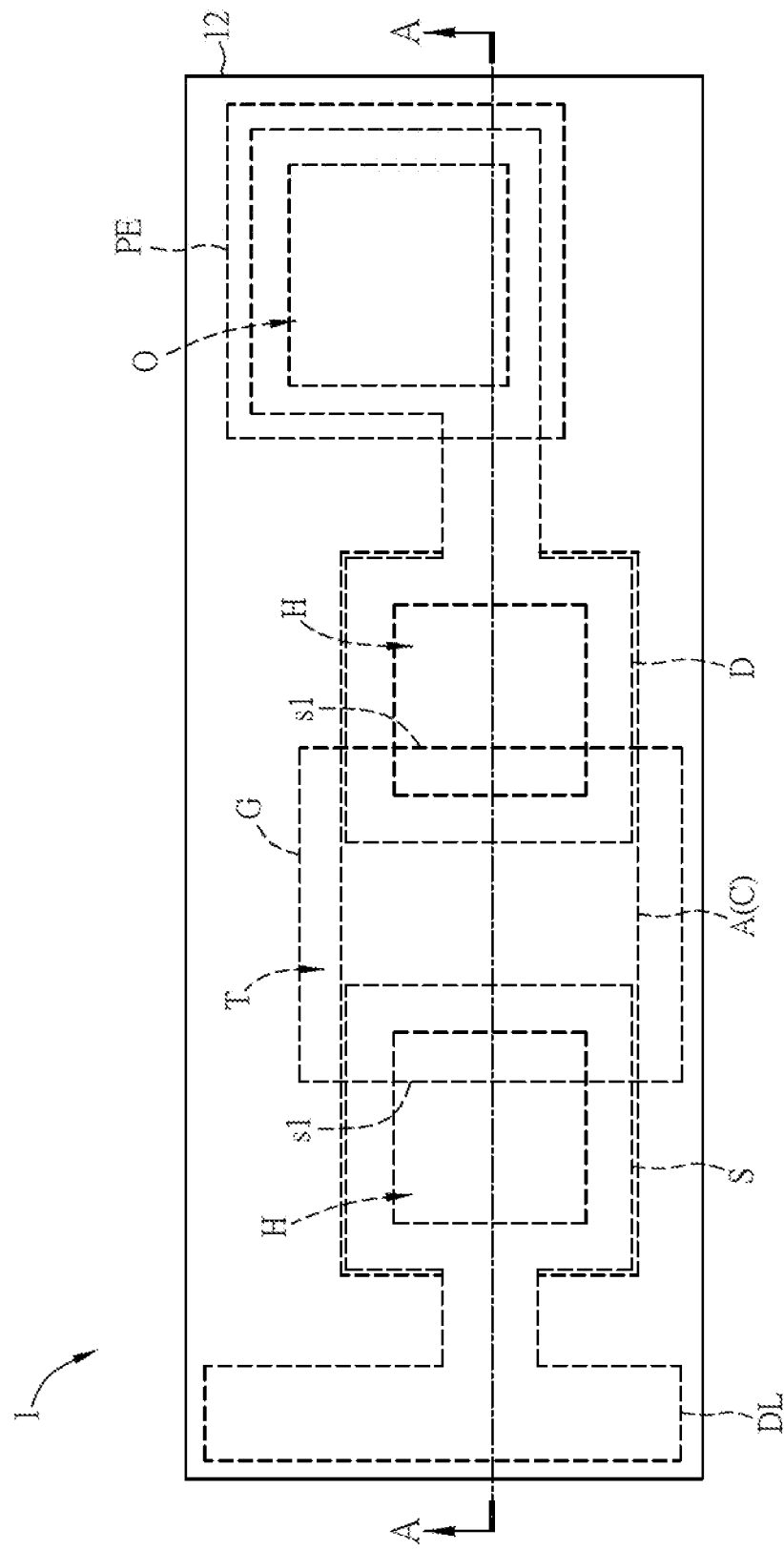
FIG. 1A is a schematic top view of the display panel of an embodiment.
Figure 1B:
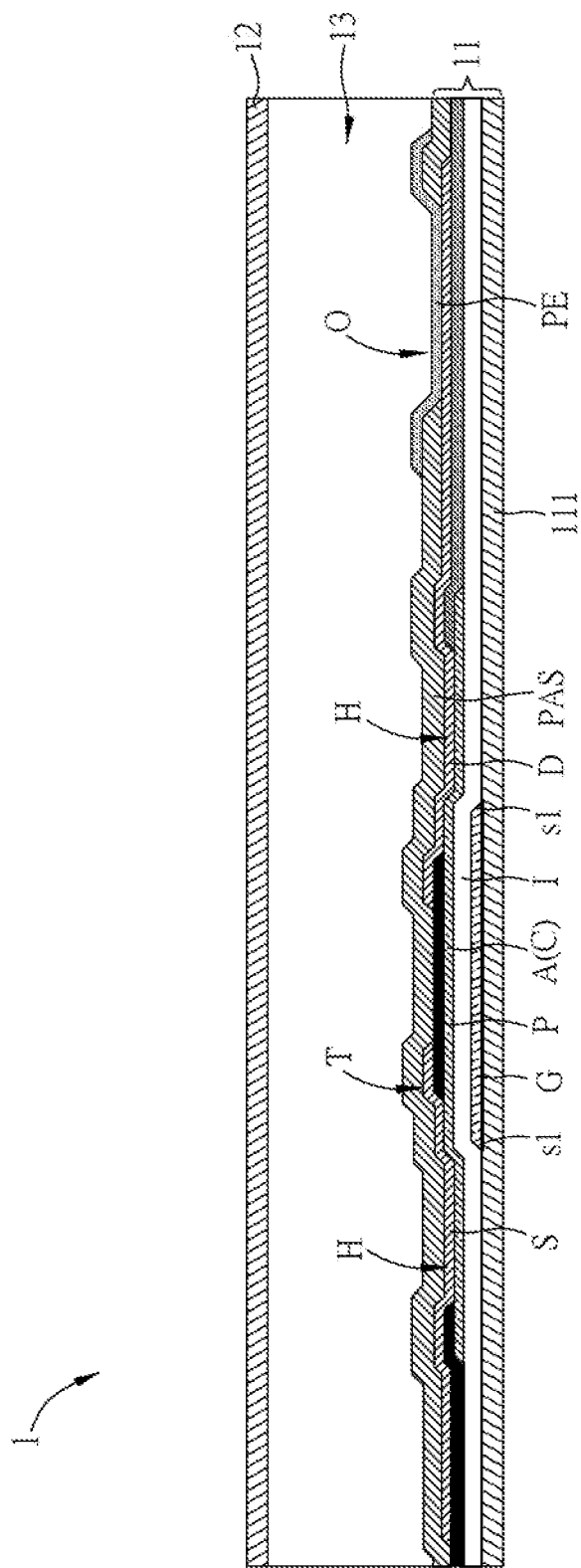
FIG. 1B is a schematic sectional diagram taken along the line A-A of FIG. 1A.

Refer to FIGS. 1A and 1B, wherein FIG. 1A is a schematic top view of the display panel 1 of an embodiment and FIG. 1B is a schematic sectional diagram taken along the line A-A of FIG. 1A. Herein, FIG. 1B can correspond to a pixel (or sub-pixel) structure of the display panel 1.

The display panel 1 of this embodiment comprises a TFT substrate 11, an opposite substrate 12 and a display medium layer 13. The TFT substrate 11 and the opposite substrate 12 are disposed oppositely, and the display medium layer 13 is disposed between the TFT substrate 11 and the opposite substrate 12. Each of the TFT substrate 11 and the opposite substrate 12 can comprise transparent material, and it is, for example but not limited to, a glass substrate, a quartz substrate or a plastic substrate. The display panel 1 can be an LCD panel or an organic light emitting diode (OLED) display panel. In this embodiment, the display panel 1 is illustrated as an LCD panel for example, the display medium layer 13 can be a liquid crystal layer and the opposite substrate 12 can be a color filter substrate. Alternatively, if the display panel 1 is an OLED display panel, the display medium layer 13 can be an OLED layer. In one embodiment, if the OLED layer emits white light, the opposite substrate 12 can be a color filter substrate. In another embodiment, if the OLED layer emits red light, green light and blue light for example, the opposite substrate 12 can be a cover plate to protect the OLED layer against the contamination of external moisture or objects. Or, in another embodiment, the opposite substrate 12 can be removed from the OLED display panel while a transparent material (such as protective material) can used to cover the OLED layer (the display medium layer 13) to protect the OLED layer against the contamination of external moisture or objects.

As shown in FIG. 1B, the TFT substrate 11 comprises a TFT T, a substrate 111, a passivation layer PAS and a first electrode PE.

The TFT T acts as the switch element of the pixel. The TFT T is disposed on the substrate 111 and comprises a gate G, a metal oxide layer A, a source S, a drain D and a protection layer P. In this embodiment, a bottom-gate TFT is illustrated for example. To clearly illustrate the features of this disclosure, the substrate 111, the display medium layer 13, the dielectric layer I and the passivation layer PAS of FIG. 1B are not shown in FIG. 1A.

The substrate 111 can be made of the transparent material, such as glass, quartz or plastic material, but this disclosure is not limited thereto. The gate G is disposed on the substrate 111 and can be a single-layer or multi-layer structure formed by metal (e.g. aluminum, copper, silver, molybdenum or titanium) or metal alloy. A part of the wires, such as scan lines (not shown), for transmitting driving signals can be located at the same layer and formed in the same process as the gate G, and they can be electrically connected to each other (Such the same metal layer is the so-called metal one M1, not shown). The dielectric layer I is disposed on the gate G and the substrate 111, and it may be a single-layer or multi-layer structure formed by organic material (such as silicon-based organic compound, organic silicon/oxide compound), inorganic material (such as silicon nitride, silicon oxide, silicon oxynitride, silicon carbide, aluminum oxide, hafnium oxide), or their any combination. However, this disclosure is not limited thereto. The dielectric layer I can completely cover the gate G and it can partially or totally cover the substrate 111.

The metal oxide layer A is disposed on the dielectric layer I and corresponding to the gate G. The source S and the drain D are disposed on and contact the metal oxide layer A. An interval exists between the source S and the drain D. Herein, the interval refers to that the source S and the drain D are not connected to each other and they are separated by a distance. Each of the source S and the drain D can be a single-layer or multi-layer structure, and can be formed by metal or metal alloy. Examples of suitable metal can be aluminum, copper, silver, molybdenum or titanium. An example of suitable multi-layer structure can be a multi-layer metal structure of molybdenum nitride/aluminum/molybdenum nitride. A part of the wires, such as data lines DL, for transmitting driving signals may be located at the same layer and formed in the same process as the source S and the drain D (the so-called second metal layer M2, not shown). Moreover, the metal oxide layer A of this embodiment acts as a channel layer C (or called the active layer) of the TFT T, and the dielectric layer I is disposed between the gate G and the channel layer C. The material of the metal oxide layer A (channel layer C) can comprise a metal oxide semiconductor, for example. The metal oxide semiconductor can be oxide of a metal selected from the group consisting of indium, gallium, zinc tin, and mixtures thereof. For example, the metal oxide semiconductor can be indium gallium zinc oxide (IGZO).

The protection layer P can be disposed on the metal oxide layer A (channel layer C). Herein, the protection layer P can act as an etch stop layer of the TFT T. The source S and the drain D are disposed on the metal oxide layer A (channel layer C), and each of the source S and the drain D is disposed in an opening H of the protection layer P and contacts the metal oxide layer A through the opening H. In this embodiment, the protection layer P is disposed on the channel layer C and comprises two openings H corresponding to the source S and the drain D. The openings H expose the channel layer C, so that the source S or the drain D is disposed in one of the openings H to contact the channel C. When the channel layer C of the TFT T is not turned on to be conductive, the source S and the drain D are electrically separated from each other. The protection layer P can be a single-layer or multi-layer structure, and can be formed by organic material (such as silicon-based organic compound, organic silicon/oxide compound), inorganic material (such as silicon nitride, silicon oxide, silicon oxynitride, silicon carbide, aluminum oxide, hafnium oxide), or their any combination for example. However, this disclosure is not limited thereto.

In some embodiments, a side of the gate G or a side of the metal oxide layer A partially overlaps the opening H. In this embodiment, as shown in FIG. 1A of a top view, the gate G comprises two opposite first sides s1, and the first sides s1 respectively partially overlap the two openings H of the protection layer P (for a top view, the first side s1 passes through the opening H). Moreover, as shown in FIG. 1B of a sectional diagram, the first sides s1 of the gate G are correspondingly partially disposed within the openings H.

The passivation layer PAS can be disposed on and covers the TFT T, and it comprises an opening O. The passivation layer PAS can be made of organic material such as PFA (polyfluoroalkoxy) or silicon-based organic compound or can be made of inorganic material such as silicon oxide (SiOx) or silicon nitride (SiNx). The passivation layer PAS can be a single-layer or multi-layer structure. Moreover, a first electrode PE can be disposed on the passivation layer PAS and filled into the opening O of the passivation layer PAS to connect the drain D. In this embodiment, the first electrode PE can be a pixel electrode. The opposite substrate 12 can comprise a second electrode (not shown), and the second electrode can act as a common electrode. The material of the first electrode PE or the second electrode may be, for example, ITO (indium tin oxide), IZO (indium zinc oxide), AZO (Al-doped zinc oxide), CTO (cadmium tin oxide), SnO2, ZnO or other transparent conducting materials.

When a scan signal is sequentially received by the scan lines of the display panel 1, it turns on the TFTs T relating to the corresponding scan line. Then, the data signals can be transmitted to the first electrodes PE at the corresponding pixels through the data lines DL. Thus, the display panel 1 can display images accordingly.

Accordingly, assuming the corresponding elements are applied with the configuration in the conventional art, the gate G of the TFT T is almost as wide as the metal oxide layer A (the channel layer C). Therefore, the two opposite first sides s1 of the gate G are disposed outside the openings H instead of overlapping the openings H. However, in this embodiment compared with the conventional art, the first sides s1 of the gate G respectively partially overlap the openings H of the protection layer P, so that the gate G has a less area than the conventional art. The feedthrough voltage caused by the feedthrough effect is related to the overlap area between the first metal layer M1 and the second metal layer M2, so if the overlap area between the first metal layer M1 and the second metal layer M2 is larger, the feedthrough voltage will be raised and the display quality of the pixel will be thus deteriorated. Therefore, in comparison with the conventional art, the overlap area between the gate G (the first metal layer M1) and the source S or the drain D (the second metal layer M2) is less in this embodiment, so the feedthrough voltage of the pixel can be lowered down and the display quality can be less influenced. Accordingly, the display quality of the display panel 1 can be enhanced.

FIGS. 2A to 4B are schematic top views and the corresponding sectional diagrams of the display panels $1a$, $1b$, $1c$ of different embodiments.

Figure 2A:
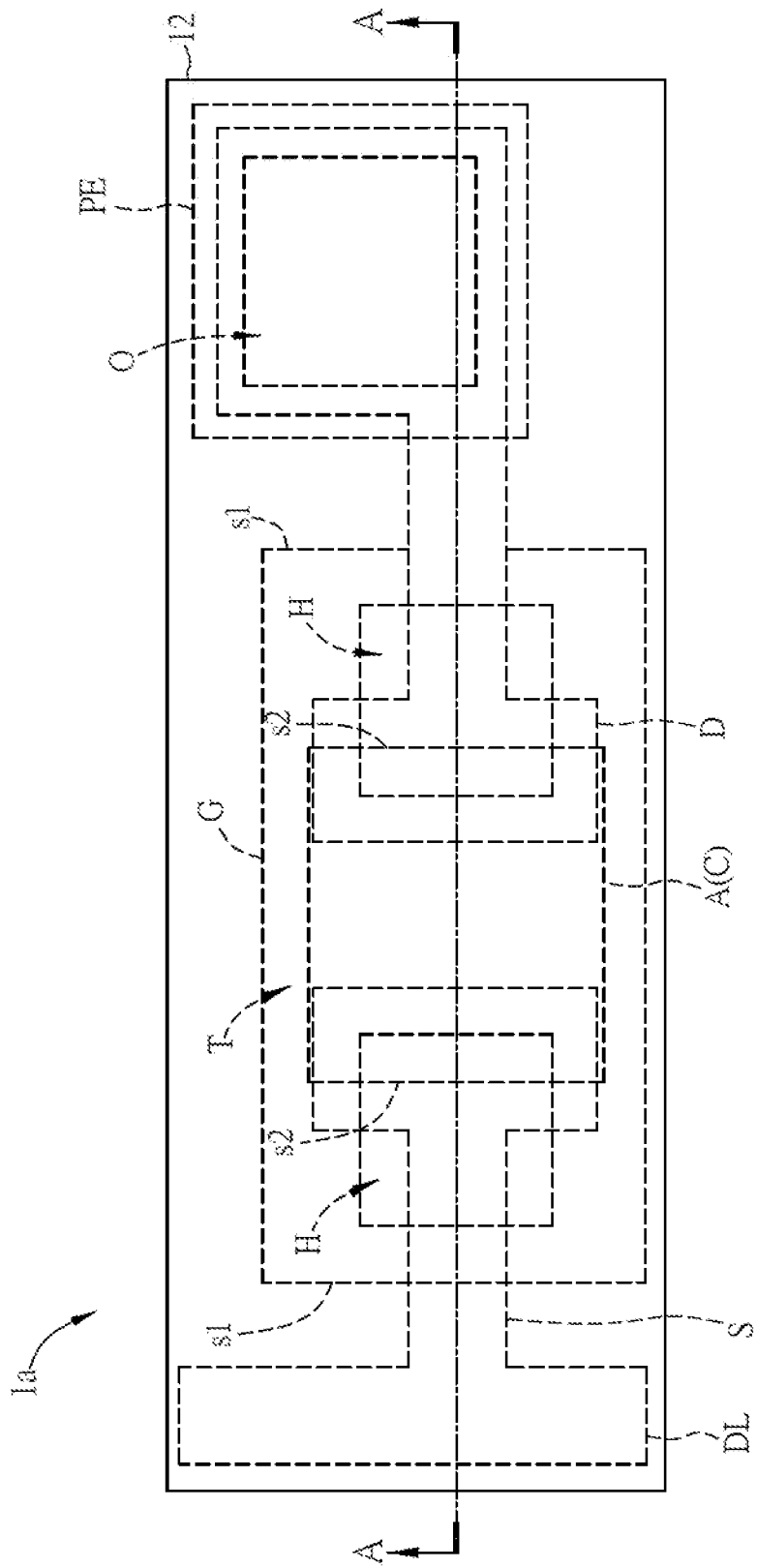
FIGS. 2A and 2B are schematic top views and the corresponding sectional diagrams of the display panels of different embodiments.
Figure 2B:
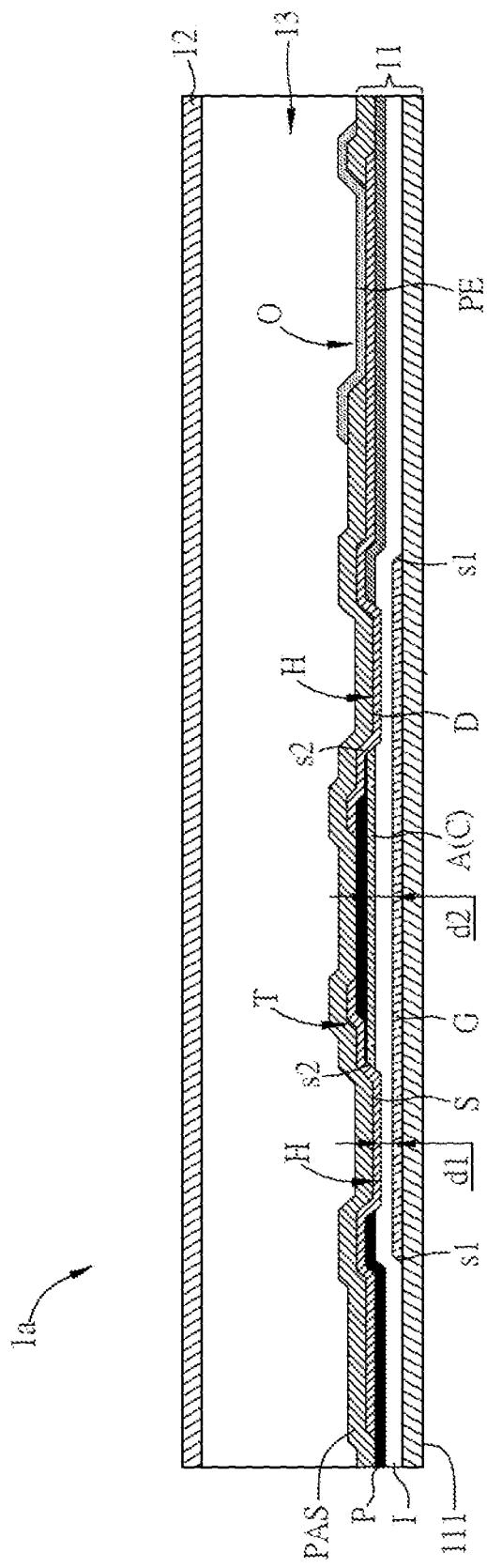

As shown in FIGS. 2A and 2B, the main difference between the display panel $1a$ and the display panel 1 is that the two opposite first sides s1 of the gate G of the display panel $1a$ are disposed outside the corresponding openings H. Furthermore, the metal oxide layer A (the channel layer C) comprises two opposite second sides s2, and the second sides s2 respectively partially overlap the two openings H of the protection layer P, so that the source S and the drain D disposed in the openings H contact the dielectric layer I and the metal oxide layer A.

In this embodiment, the dielectric layer I disposed in one of the openings H has a first thickness d1, and the dielectric layer I disposed between the channel layer C and the gate G has a second thickness d2. The difference between the second thickness d2 and the first thickness d1 can be larger than or equal to zero and less than 3000 Å ($0 \le (d2-d1) < 3000$ Å). Or, the difference between the second thickness d2 and the first thickness d1 can be larger than or equal to zero and less than the thickness of the protection layer P ($0 \le (d2-d1)$ <the thickness of the protection layer P, the thickness of the protection layer P is 3000 Å for example).

Accordingly, in this embodiment, as shown in FIG. 2A of a top view, the channel layer C comprises two opposite second sides s2, and the second sides s2 respectively partially overlap the two openings H of the protection layer P (for a top view, the second side s2 passes through the opening H). Furthermore, as shown in FIG. 2B of a sectional diagram, the second sides s2 of the channel layer C are partially disposed within the corresponding openings H. Moreover, other technical features of the display panel $1a$ can be comprehended by referring to the display panel 1, so the related illustrations are omitted here for conciseness.

Accordingly, assuming the corresponding elements are applied with the configuration in the conventional art, the metal oxide layer (the channel layer) of the TFT T is almost as wide as the gate G, so the two opposite second sides s2 of the metal oxide layer A (the channel layer C) are disposed outside the openings H instead of overlapping the openings H. However, in this embodiment compared with the conventional art, the second sides s2 of the metal oxide layer A respectively partially overlap the openings H of the protection layer P, so that the metal oxide layer A has a less area than the conventional art. Correspondingly, the area of each of the source S and the drain D also can be reduced. Therefore, in comparison with the conventional art, the overlap area between the gate G (the first metal layer M1) and the source S or the drain D (the second metal layer M2) is also less in this embodiment, so the feedthrough voltage of the pixel can be lowered down and the display quality can be enhanced.

Figure 3A:
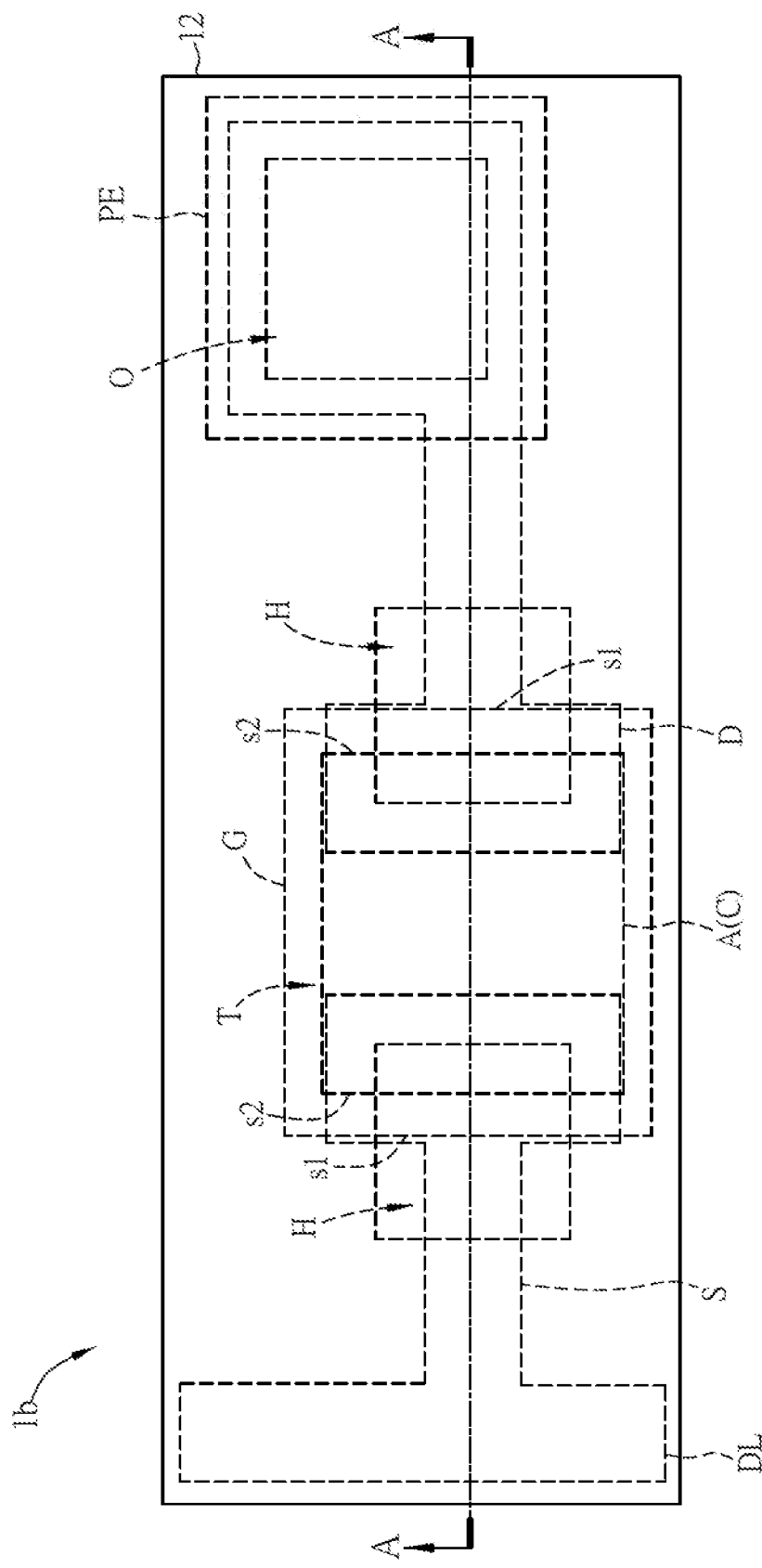
FIGS. 3A and 3B are schematic top views and the corresponding sectional diagrams of the display panels of different embodiments.
Figure 3B:
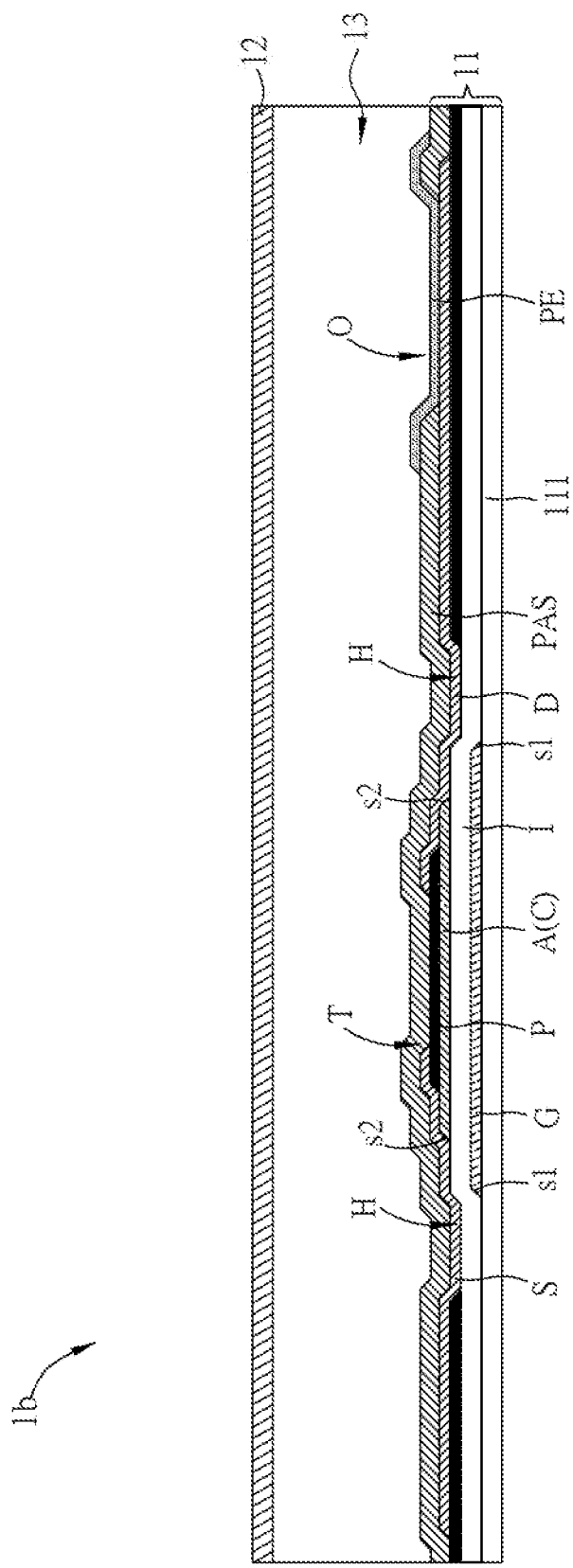

As shown in FIGS. 3A and 3B, the main difference between the display panel $1b$ and the display panel $1a$ is that the second sides s2 of the metal oxide layer A (the channel layer C) respectively partially overlap the two openings H of the protection layer P, and the first sides s1 of the gate G of the display panel $1b$ also respectively partially overlap the two openings H, so that the source S and the drain D disposed in the openings H contact the dielectric layer I and the metal oxide layer A.

Accordingly, in this embodiment, as shown in FIG. 3A of a top view, the first sides s1 of the gate G respectively partially overlap the two openings H of the protection layer P, and the second sides s2 of the channel layer C respectively partially overlap the two openings H of the protection layer P (from the top view, the first side s1 and the second side s2 pass across the opening H). Furthermore, as shown in FIG. 3B which is a sectional diagram, the first sides s1 of the gate G are partially disposed within the corresponding openings H and the second sides s2 of the channel layer C are also partially disposed within the corresponding openings H. Moreover, other technical features of the display panel 1b can be comprehended by referring to the display panel 1, so the related illustrations are omitted here for conciseness.

Accordingly, in this embodiment, the first sides s1 of the gate G respectively partially overlap the two openings H of the protection layer P, and the second sides s2 of the channel layer C respectively partially overlap the two openings H of the protection layer P, so that the areas prepared for the gate G and the channel layer C are both less than the conventional art. Accordingly, the areas prepared for the source S and the drain D can be reduced with respect to the area of the channel layer C. Therefore, in comparison with the conventional art, the overlap area between the gate G (the first metal layer M1) and the source S or the drain D (the second metal layer M2) becomes smaller in this embodiment, so the feedthrough voltage of the pixel can be lowered down and the display quality can be improved. Besides, the overlap area between the gate G and the source S or the drain D is reduced, so that the opening O of the passivation layer PAS can be formed closer to the adjacent (left side) gate G or the channel layer C. Thereby, the transparent area in the pixel can be enlarged so as to increase the aperture ratio of the pixel. Moreover, because the pixel area can be made smaller, this embodiment can be applied to the high PPI (pixels per inch) panel.

Figure 4A:
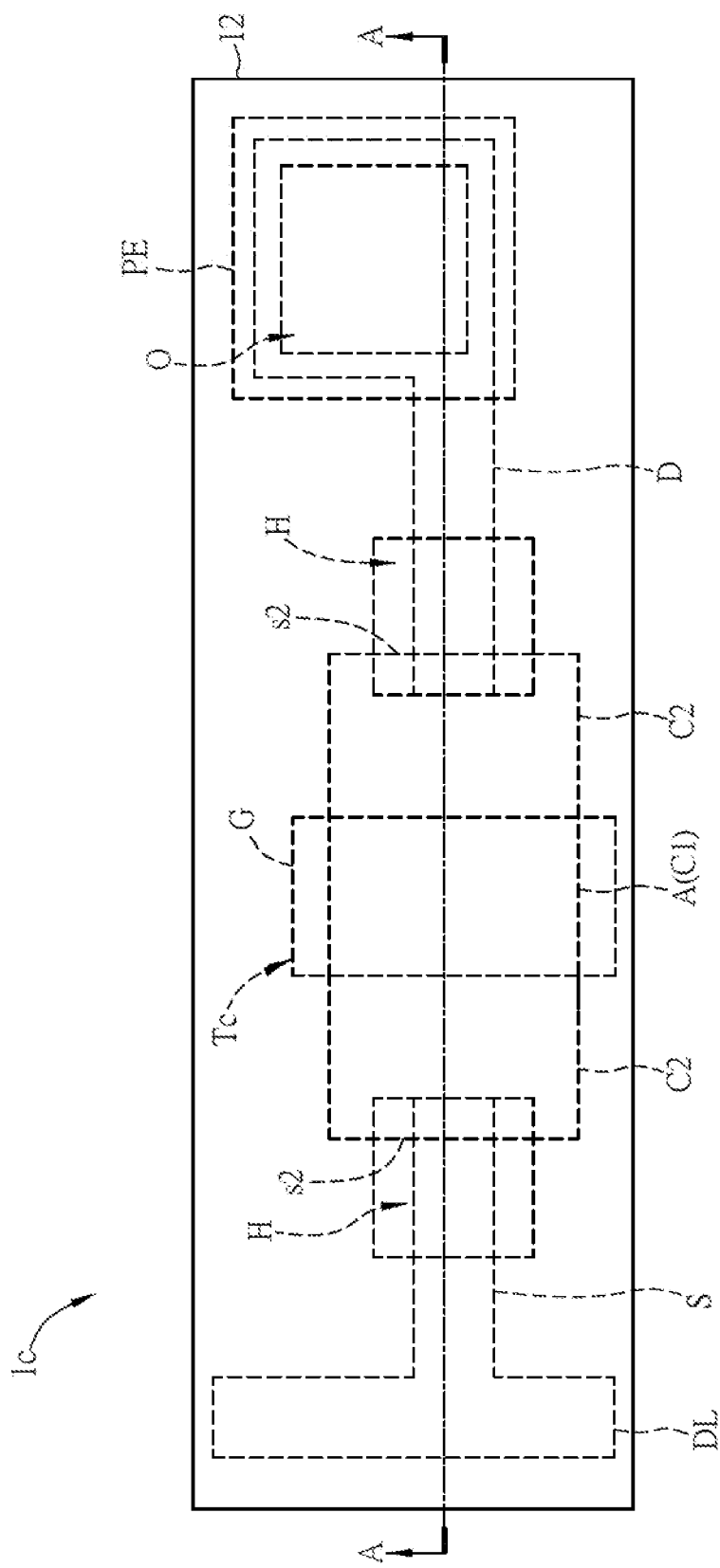
FIGS. 4A and 4B are schematic top views and the corresponding sectional diagrams of the display panels of different embodiments.
Figure 4B:
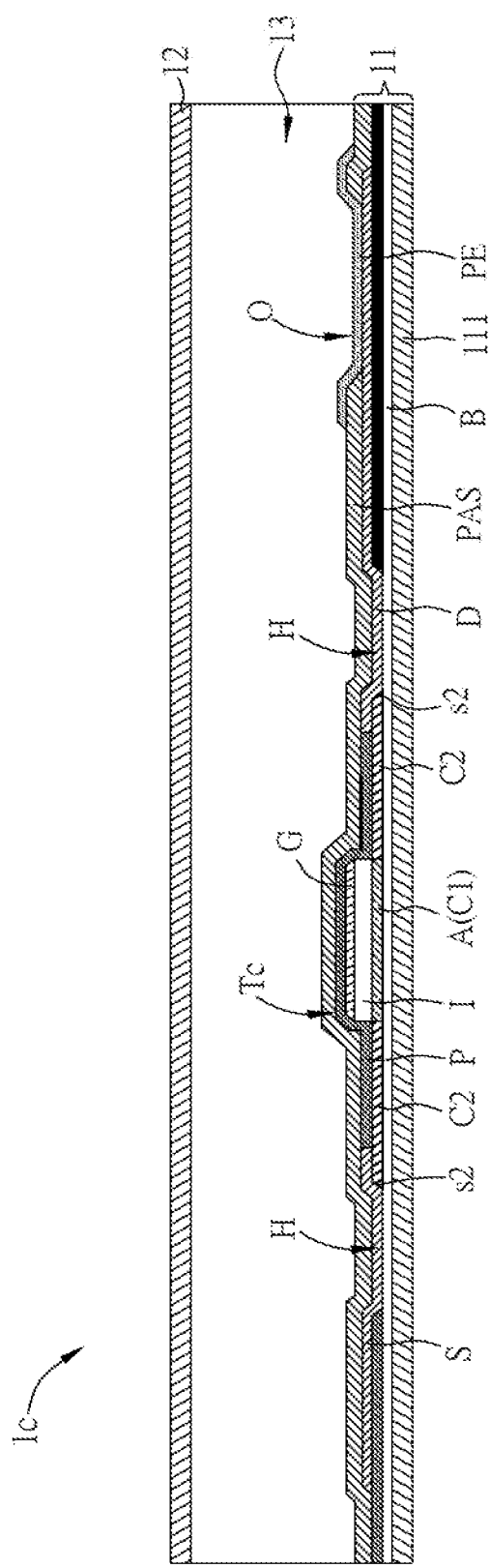

As shown in FIGS. 4A and 4B, the main difference between the display panel 1c and the display panel 1 is that the TFT Tc of the display panel 1c is a top-gate TFT. A buffer layer B is disposed on the substrate 111. The metal oxide layer A of the display panel 1c is disposed on the buffer layer B. The buffer layer B is made of, for example but not limited to, silicon dioxide (SiO2) to separate the metal oxide layer A from the substrate 111. The metal oxide layer A of this embodiment comprises a channel area C1 and two conducting areas C2 respectively disposed on two sides of the channel area C1. The gate G is disposed on the channel area C1 by a dielectric layer I and thus corresponds to the channel area C1. The channel area C1 can be made of metal oxide semiconductor such as IGZO, and is an active layer of the TFT Tc. Moreover, the source S or the drain D of this embodiment is also disposed in the opening H and contacts the buffer layer B and one of the conducting areas C2.

Other technical features of the display panel 1c can be comprehended by referring to the display panel 1, so the related illustrations are omitted here for conciseness.

To be noted, as shown in FIG. 4B, the source S and the drain D of this embodiment contact the conducting areas C2 and are electrically connected with the channel area C1 through the conducting areas C2. The conducting areas C2 and the channel area C1 can be together called the metal oxide layer A, and the characteristic of the conducting areas C2 can be changed by applying the ion bombardment to the metal oxide layer A, so that the characteristics of the conducting areas C2 and the channel area C1 at least differ in the following aspects. The impedance of the conducting area C2 is lower than that of the channel area C1, the carrier concentration of the conducting area C2 is higher than that of the channel area C1, the hydrogen ion concentration of the conducting area C2 is higher than that of the channel area C1, and the oxygen ion concentration of the conducting area C2 is lower than that of the channel area C1.

Accordingly, in this embodiment, as shown in FIG. 4A which is a top view, the second sides s2 of the metal oxide layer A respectively partially overlap the two openings H of the protection layer P (from the top view, the second side s2 passes across the opening H). Furthermore, as shown in FIG. 4B of a sectional diagram, the second sides s2 of the metal oxide layer A are partially disposed within the corresponding openings H.

Accordingly, the second sides s2 of the metal oxide layer A respectively partially overlap the two openings H of the protection layer P, so that the area of the metal oxide layer A is less than that of the conventional top-gate TFT. Therefore, in one embodiment where the metal oxide layer A is not covered by a black matrix layer, the area of the metal oxide layer A is smaller, so that the aperture ratio of the pixel can be higher than the conventional art and this embodiment can be applied to the high PPI panel.

Figure 5:
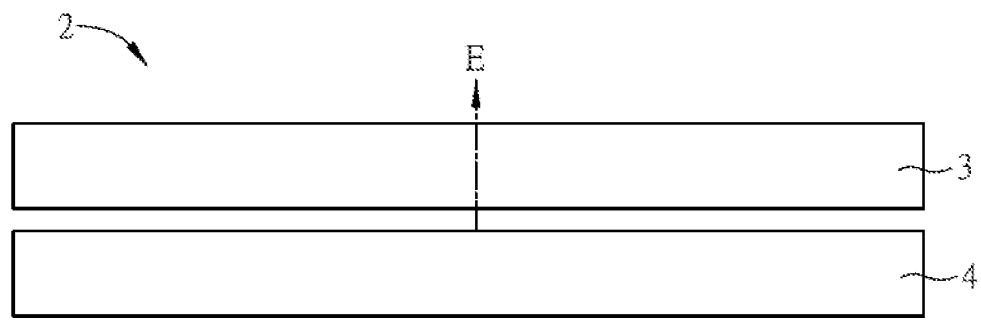
FIG. 5 is a schematic diagram of the display device of an embodiment.

Refer to FIG. 5, which is a schematic diagram of the display device 2 of an embodiment.

The display device 2 comprises a display panel 3 and a backlight module 4 disposed opposite to the display panel 3. The display device 2 can be an LCD device, and the display panel 3 can be any of the above-mentioned display panels 1, 1a, 1b, 1c or their any variation, so the description thereof is omitted here for conciseness. When the backlight module 4 emits the light E passing through the display panel 3, the pixels of the display panel 3 can display colors to form images accordingly.

Summarily, according to some embodiments, in the display panel and the display device, the protection layer of the TFT substrate is disposed on the metal oxide layer, the source and the drain respectively contact the metal oxide layer through the openings of the protection layer, and a side of the gate or the metal oxide layer partially overlaps at least one of the openings. Thereby, in some embodiments, in comparison with the conventional art, the side of the gate or the metal oxide layer partially overlaps one of the openings, so that the feedthrough voltage of the pixel can be lowered down or the aperture ratio can be increased, and the display quality can be enhanced thereby.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display panel, comprising:
    a thin film transistor (TFT) substrate comprising a TFT and a substrate, wherein the TFT is disposed on the substrate and comprises a gate, a metal oxide layer, a source, a drain and a protection layer, the gate is disposed corresponding to the metal oxide layer, the protection layer is disposed on the metal oxide layer, each of the source and the drain contacts the metal oxide layer through an opening of the protection layer, and one side of the gate or one side of the metal oxide layer partially overlaps at least one of the openings, wherein the metal oxide layer acts as a channel layer of the TFT, a dielectric layer is disposed between the gate and the channel layer, and at least one part of the dielectric layer is under the one of the openings, the dielectric layer disposed under the one of the openings has a first thickness, the dielectric layer disposed between the channel layer and the gate has a second thickness, the difference between the second thickness and the first thickness is lamer than zero and less than 3000 Å, or the difference is larger than zero and less than the thickness of the protection layer; and a display medium layer disposed on the TFT substrate.

2. The display panel as recited in claim 1, wherein the material of the channel layer is metal oxide semiconductor.

3. The display panel as recited in claim 1, wherein the source or the drain is located in the one of the openings and contacts the dielectric layer or the channel layer.

4. The display panel as recited in claim 1, wherein the gate comprises two opposite first sides, and the first sides respectively partially overlap the two openings of the protection layer.

5. The display panel as recited in claim 1, wherein the metal oxide layer comprises two opposite second sides, and the second sides respectively partially overlap the two openings of the protection layer.

6. The display panel as recited in claim 1, wherein the gate comprises two opposite first sides, the metal oxide layer comprises two opposite second sides, the first sides respectively partially overlap the two openings of the protection layer and the second sides respectively partially overlap the two openings of the protection layer.

7. A display device, comprising:

a display panel comprising a TFT substrate and a display medium layer, wherein the display medium layer is disposed on the TFT substrate, the TFT substrate comprises a TFT and a substrate, the TFT is disposed on the substrate and comprises a gate, a metal oxide layer, a source, a drain and a protection layer, the gate is disposed corresponding to the metal oxide layer, the protection layer is disposed on the metal oxide layer, each of the source and the drain contacts the metal oxide layer through an opening of the protection layer, and one side of the gate or one side of the metal oxide layer partially overlaps at least one of the openings, wherein the metal oxide layer acts as a channel layer of the TFT, a dielectric layer is disposed between the gate and the channel layer, and at least one part of the dielectric layer is under the one of the openings, the dielectric layer disposed under the one of the openings has a first thickness, the dielectric layer disposed between the channel layer and the gate has a second thickness, the difference between the second thickness and the first thickness is larger than zero and less than 3000 Å, or the difference is larger than zero and less than the thickness of the protection layer; and a backlight module disposed opposite to the display panel.

8. A display panel, comprising:

a thin film transistor (TFT) substrate comprising a TFT and a substrate, wherein the TFT is disposed on the substrate and comprises a gate, a metal oxide layer, a source, a drain and a protection layer, the gate is disposed corresponding to the metal oxide layer, the protection layer is disposed on the metal oxide layer, each of the source and the drain contacts the metal oxide layer through an opening of the protection layer, and one side of the gate or one side of the metal oxide layer partially overlaps at least one of the openings; and a display medium layer disposed on the TFT substrate, wherein the TFT substrate further comprises a buffer layer disposed on the substrate, wherein the metal oxide layer is disposed on the buffer layer, the metal oxide layer comprises a channel area, the gate is disposed on the channel area by a dielectric layer, and the material of the channel area is metal oxide semiconductor, wherein the metal oxide layer further comprises two conducting areas respectively located at two sides of the channel area, the source or the drain is disposed in one of the openings and contacts the buffer layer and one of the conducting areas.

* * * * *